United States Patent
Lin

Patent Number: 5,740,014
Date of Patent: Apr. 14, 1998

[54] CPU HEAT SINK

[76] Inventor: Chun Sheng Lin, 31, Sec. 1, Min-1 Road, Wu-Ku Hsiang, Taipei Hsien, Taiwan

[21] Appl. No.: 763,812

[22] Filed: Dec. 11, 1996

[51] Int. Cl.⁶ .................................................. H05K 7/20
[52] U.S. Cl. ................... 361/697; 165/80.3; 165/121; 165/185; 174/16.3; 257/713; 257/722
[58] Field of Search ..................... 165/80.2, 80.3, 165/121–122, 185; 174/16.3; 257/706–707, 712–713, 721–722; 361/695, 697, 704, 707, 718, 722

[56] References Cited

U.S. PATENT DOCUMENTS

| | | | |
|---|---|---|---|
| 5,377,765 | 1/1995 | Hsieh | 165/80.3 |
| 5,424,580 | 6/1995 | Tustaniwskyj et al. | 257/713 |
| 5,452,181 | 9/1995 | Hoover | 361/697 |
| 5,486,980 | 1/1996 | Jordan et al. | 361/697 |
| 5,584,339 | 12/1996 | Hong | 361/697 |

*Primary Examiner*—Gregory D. Thompson
*Attorney, Agent, or Firm*—A & J

[57] ABSTRACT

A CPU heat sink mounted on a CPU an carrying a fan above the CPU, the CPU heat sink having a flat base mounted on the CPU, the flat base having a thicker middle section disposed in contact with the CPU, and two thinner lateral sections bilaterally extended from the thicker middle section and spaced above the CPU, a plurality of upright fins longitudinally raised from the flat base, a plurality of ventilation grooves transversely cut through the upright fins for guiding currents of air from the fan through the upright fins, and, a plurality of ventilation slots transversely cut through the upright fins and the thinner lateral sections of the flat base for guiding currents of air from the fan toward the CPU.

1 Claim, 2 Drawing Sheets

CPU HEAT SINK

BACKGROUND OF THE INVENTION

1. Field of the Invention

This invention relates to CPU heat sinks, and more particularly to such a CPU heat sink which permits currents of air to flow from the fan toward the top side of the CPU, so that heat can be quickly and effectively carried away from the CPU.

2. Description of the Prior Art

When the CPU of an electronic apparatus, for example, a computer is operated, heat must be quickly carried away from the CPU so that the operation of the CPU can be maintained normal. Conventional heat dissipating apparatus for this purpose are commonly comprised of a heat sink having a plurality of upright radiating fins and adapted for mounting on the CPU at the top, and a fan adapted for mounting on the heat sink above the CPU. Because the heat sink is disposed in close contact with the top side of the CPU and the fan is carried on the heat sink at the top side, currents of air cannot be directly guided to the top side of the CPU. Therefore, the heat dissipating efficiency of conventional heat dissipating apparatus is limited.

SUMMARY OF THE INVENTION

This invention relates to CPU heat sinks, and more particularly to such a CPU heat sink which permits currents of air to flow from the fan toward the top side of the CPU, so that heat can be quickly and effectively carried away from the CPU.

This invention provides a heat sink which permits currents of air to be guided from the fan toward the top side of the CPU directly, so that heat can be quickly and efficiently carried away from the CPU. According to the preferred embodiment of the present invention, the CPU heat sink comprises a flat base mounted on the CPU, the flat base having a thicker middle section disposed in contact with the CPU, and two thinner lateral sections bilaterally extended from the thicker middle section and spaced above the CPU, a plurality of upright fins longitudinally raised from the flat base, a plurality of ventilation grooves transversely cut through the upright fins for guiding currents of air from the fan through the upright fins, and, a plurality of ventilation slots transversely cut through the upright fins and the thinner lateral sections of the flat base for guiding currents of air from the fan toward the CPU.

DETAILED DESCRIPTION OF THE PREFERRED EMBODIMENT

Figure 1:
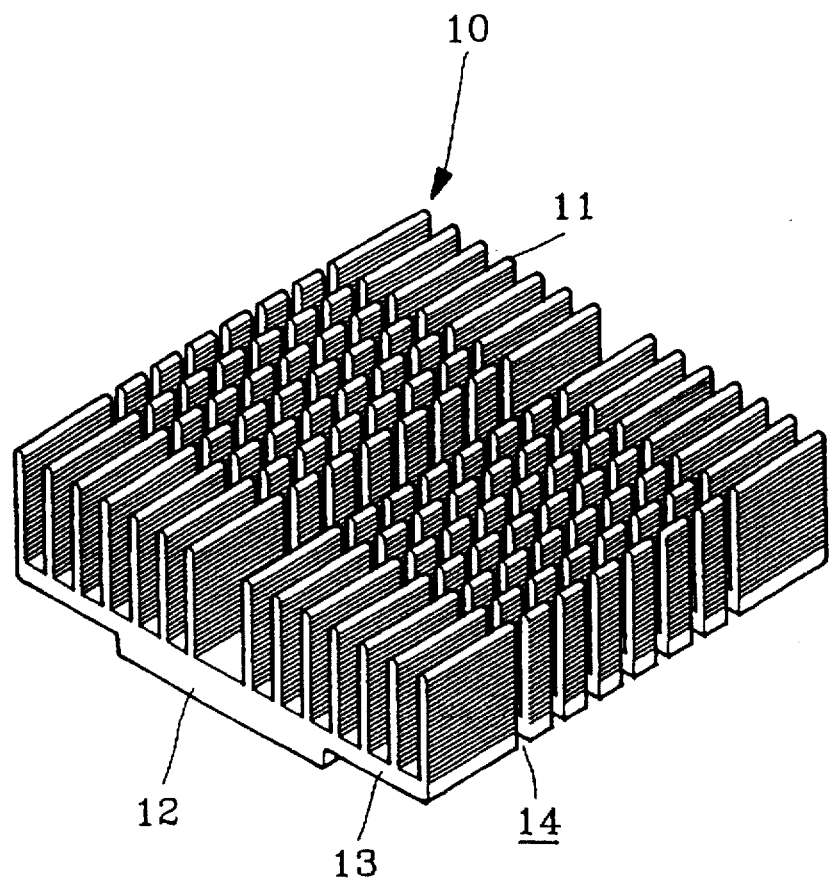
FIG. 1 is an elevational view of a CPU heat sink according to the present invention.

For the purpose of promoting an understanding of the principles of the invention, reference will now be made to the embodiment illustrated in the drawings. Specific language will be used to describe same. It will, nevertheless, be understood that no limitation of the scope of the invention is thereby intended, such alterations and further modifications in the illustrated device, and such further applications of the principles of the invention as illustrated herein being contemplated as would normally occur to one skilled in the art to which the invention relates.

Figure 2:
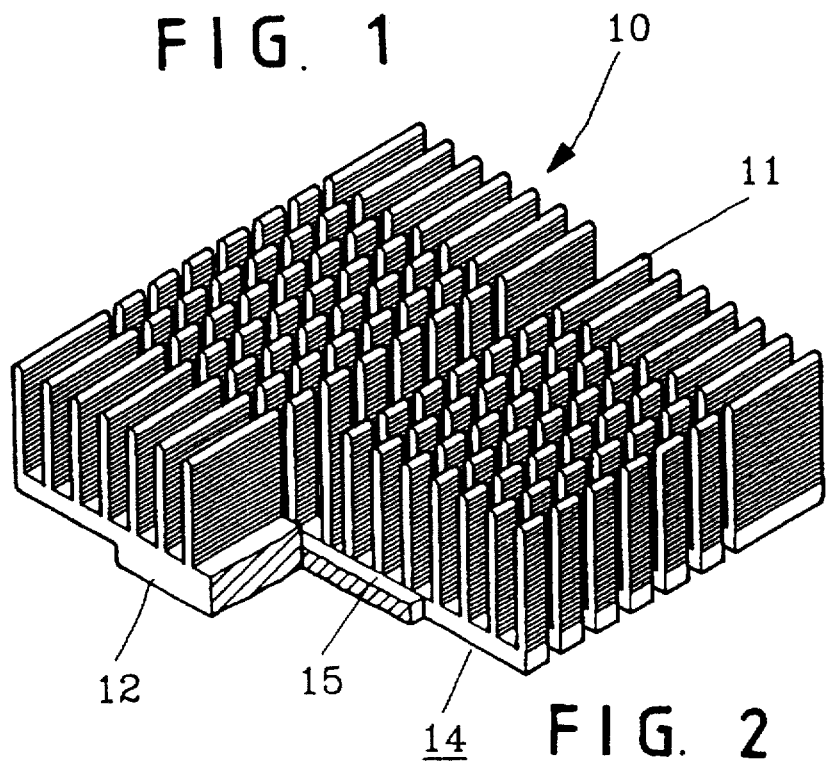
FIG. 2 is a sectional elevational view of the CPU heat sink shown in FIG. 1.

Referring to FIG. 1, the heat sink, referenced by 10, comprises a plurality of upright fins 11 raised from the top and arranged in longitudinal direction, a flat contact flange 12 longitudinally raised from the bottom in the middle. Therefore, two thinner base sections 13 are formed at two opposite sides relative to the flat contact flange 12. When the heat sink 10 is extruded from aluminum, it is cut in transverse direction by a cutting machine, therefore a plurality of transverse grooves 15 are formed through the upright fins 11, and a plurality of transverse slots 14 are formed through the upright fins 11 are formed through the thinner base sections 13 (see FIG. 2).

Figure 3:
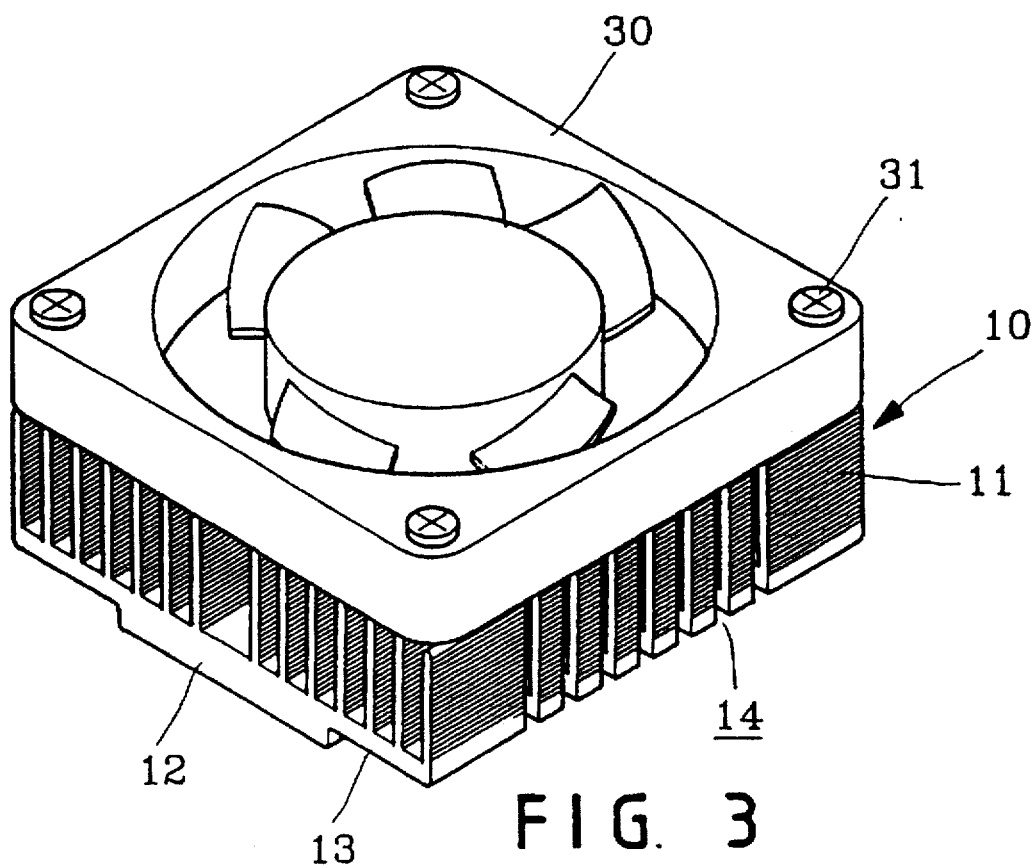
FIG. 3 shows a fan installed in the CPU heat sink according to the present invention.
Figure 4:
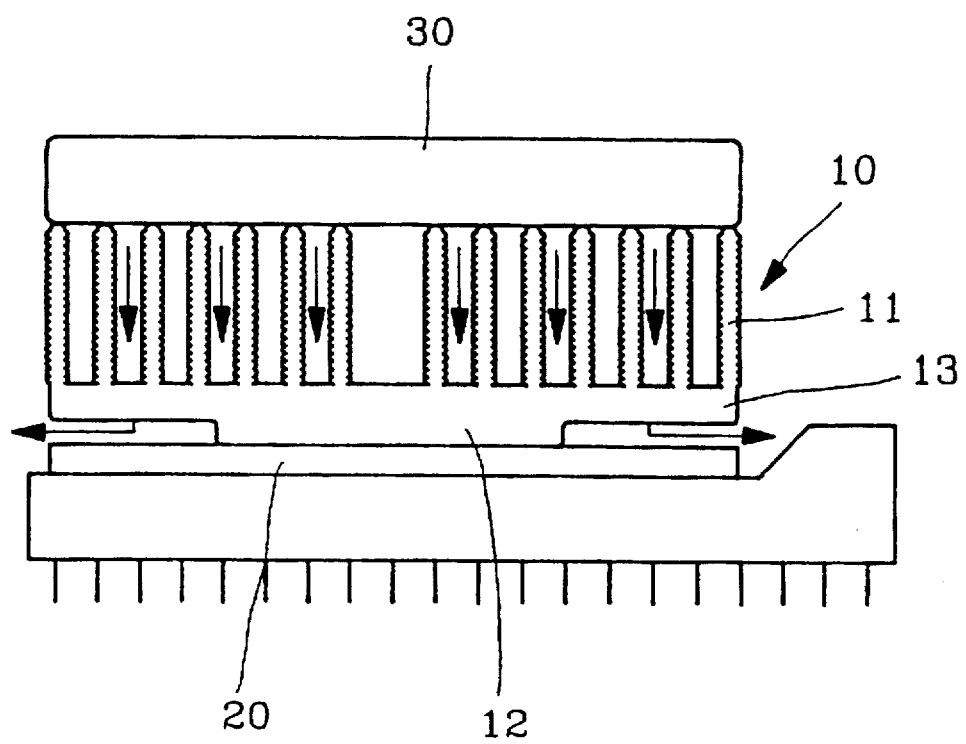
FIG. 4 is an applied view of the present invention, showing moving directions of currents of air from the fan according to the present invention.

Referring to FIGS. 3 and 4, a fan 30 is supported on the upright fins 11, and fixedly secured to the heat sink 10 by screws 31 (see FIG. 3). When the heat sink 10 is mounted on a CPU 20, the flat contact flange 12 is disposed in close contact with the top side of the CPU 20, and the two thinner base sections 13 of the heat sink 10 are spaced from the top side of the CPU 20 at a distance (see FIG. 4). When the fan 30 is operated, currents of air are partially guided through the transverse grooves 15 in the upright fins 11, and partially guided toward the top side of the CPU 20 via the transverse slots 14 (see FIGS. 2 and 4), therefore heat can be quickly carried away from the CPU 20.

The invention is naturally not limited in any sense to the particular features specified in the forgoing or to the details of the particular embodiment which has been chosen in order to illustrate the invention. Consideration can be given to all kinds of variants of the particular embodiment which has been described by way of example and of its constituent elements without thereby departing from the scope of the invention. This invention accordingly includes all the means constituting technical equivalents of the means described as well as their combinations.

I claim:

1. A CPU heat sink mounted on a CPU an carrying a fan above said CPU, the CPU heat sink comprising:

a flat base mounted on said CPU, said flat base comprising a thicker middle section disposed in contact with said CPU, and two thinner lateral sections bilaterally extended from said thicker middle section and having a respective top side disposed in flush with said thicker middle section and a respective bottom side spaced above said CPU at a distance;

a plurality of upright fins longitudinally raised from said flat base;

a plurality of ventilation grooves transversely cut through said upright fins for guiding currents of air from said fan through said upright fins; and, a plurality of ventilation slots transversely cut through said upright fins and the thinner lateral sections of said flat base for guiding currents of air from said fan toward said CPU.

* * * * *